(12) United States Patent
Han et al.

(10) Patent No.: US 8,854,292 B2
(45) Date of Patent: *Oct. 7, 2014

(54) GATE DRIVE CIRCUIT AND DISPLAY APPARATUS HAVING THE SAME

(71) Applicant: Samsung Display Co., Ltd., Yongin (KR)

(72) Inventors: Jong-Heon Han, Hwaseong-si (KR); Seob Shin, Yongin-si (KR); Jae-Kyoung Kim, Seoul (KR)

(73) Assignee: Samsung Display Co., Ltd., Yongin, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/054,199

(22) Filed: Oct. 15, 2013

(65) Prior Publication Data

US 2014/0043222 A1    Feb. 13, 2014

(30) Foreign Application Priority Data

Jan. 5, 2009  (KR) ......................... 10-2009-0000439

(51) Int. Cl.
```
G09G 3/36     (2006.01)
G11C 27/04    (2006.01)
G11C 19/18    (2006.01)
H03K 17/16    (2006.01)
G11C 19/28    (2006.01)
```
(52) U.S. Cl.
CPC ........ *G11C 27/04* (2013.01); *G09G 2300/0408* (2013.01); *G11C 19/18* (2013.01); *H03K 17/162* (2013.01); *G11C 19/28* (2013.01); *G09G 2310/0286* (2013.01); *G09G 3/3685* (2013.01); *G09G 3/3677* (2013.01)
USPC ........................................................ 345/100

(58) Field of Classification Search
USPC ........ 345/55, 87, 100, 211, 213, 98; 327/108, 327/112; 377/64–81
See application file for complete search history.

(56) References Cited

U.S. PATENT DOCUMENTS

| | | | |
|---|---|---|---|
| 5,859,630 A | 1/1999 | Huq | |
| 7,310,402 B2 | 12/2007 | Wei et al. | |
| 2006/0022201 A1* | 2/2006 | Kim et al. | ................. 257/72 |
| 2006/0056267 A1* | 3/2006 | Kim et al. | ........... 365/230.06 |
| 2007/0296681 A1 | 12/2007 | Kim et al. | |
| 2008/0018572 A1* | 1/2008 | Shin et al. | ................. 345/87 |
| 2008/0088555 A1* | 4/2008 | Shin et al. | ................. 345/87 |

* cited by examiner

*Primary Examiner* — Pegeman Karimi
(74) *Attorney, Agent, or Firm* — F. Chau & Associates, LLC

(57) ABSTRACT

A gate drive circuit includes a plurality of stages connected one after another to each other. Each of the stages includes a charging section, a driving section, a discharging section, a holding section and a holding control section. The driving section pulls up a high level of a first clock signal to output a gate signal. The discharging section discharges a voltage potential of a first node to a first off-voltage. The holding section holds a voltage potential of the first node to the first off-voltage. The holding control section receives the first clock signal and a second clock signal. The holding control section holds a voltage potential of the holding section to a second off-voltage through a second node in accordance with the second clock signal to prevent floating of the holding section.

9 Claims, 7 Drawing Sheets

GATE DRIVE CIRCUIT AND DISPLAY APPARATUS HAVING THE SAME

CROSS-REFERENCE TO RELATED APPLICATIONS

This application is a divisional application of U.S. patent application Ser. No. 12/533,771 filed on Jul. 31, 2009 and claims priority to and the benefit of Korean Patent Application No. 2009-439, filed on Jan. 5, 2009 in the Korean Intellectual Property Office (KIPO), the entire content of both of which is incorporated by reference herein.

BACKGROUND OF THE INVENTION

1. Field of the Invention

The present disclosure relates to display devices, and, more particularly to a gate drive circuit and a display apparatus having the gate drive circuit.

2. Discussion of the Related Art

Generally, a liquid crystal display (LCD) apparatus includes an LCD panel that displays images using the light transmittance of liquid crystal molecules, and a backlight assembly disposed below the LCD panel to provide the LCD panel with light.

The LCD apparatus includes a display panel, a gate driver and a data driver. The display panel includes a plurality of gate lines, a plurality of data lines, and a plurality of pixels electrically connected to the gate lines and the data lines. The gate driver outputs a gate signal to the gate lines. The data driver outputs a data signal to the data line. The gate driver and the data driver are formed in a chip to be mounted on the display panel.

At present, to decrease the size of the LCD apparatus and to enhance productivity of the LCD apparatus, the gate driver is integrated on a display substrate in an amorphous silicon gate (ASG) form.

In a shift register employed in a gate drive circuit, a gate-source voltage Vgs of a unit stage of the shift register is about 0V. When an off current Ioff is increased in a state in which the gate-source voltage Vgs is about 0V, an error may be generated in off-characteristics of a transistor. Thus, defects such as crosstalk or gate block defects may be generated and result in display defects in the LCD apparatus.

SUMMARY OF THE INVENTION

Exemplary embodiments of the present invention provide a gate drive circuit that receives different off-voltages to enhance off-characteristics of transistors thereof.

Exemplary embodiments of the present invention also provide a display apparatus having the above-mentioned gate drive circuit.

According to an exemplary embodiment of the present invention, a gate drive circuit includes a plurality of stages connected one after another to each other. The plurality of stages includes a first stage in which a scan start signal is provided to an input terminal. The gate drive circuit sequentially outputs output signals of respective stages. Each of the stages includes a charging section, a driving section, a discharging section, a holding section and a holding control section. The charging section charges the scan start signal or an output signal provided from a previous stage. The driving section is coupled to the charging section through a first node. The driving section pulls up a high level of a first clock signal to output a gate signal, as the first node is charged to a high level. The discharging section is connected to the first node. The discharging section discharges a voltage potential of the first node to a first off-voltage in response to a gate signal of a high level applied from a next stage. The holding section is connected to an output node and the first node. The holding section holds the signal of the first node to the first off-voltage. The holding control section is connected to the first node and the holding section. The holding control section receives the first clock signal and a second clock signal. The holding control section holds a signal of the holding section to a second off-voltage through a second node in accordance with the second clock signal to prevent floating of the holding section.

According to an exemplary embodiment, a display apparatus includes a display panel, a data drive circuit and a gate drive circuit. The display panel includes a plurality of pixels, each pixel connected to a gate line and a data line that are crossed with each other. The data drive circuit provides the data lines with a data voltage. The gate drive circuit includes a plurality of stages connected one after another to each other. The gate drive circuit sequentially outputs output signals of respective stages. Each of the stages includes a charging section, a driving section, a discharging section, a holding section and a holding control section. The charging section charges the scan start signal or a carry signal provided from a previous stage. The driving section is coupled to the charging section through a first node. The driving section pulls up a high level of a first clock signal to output a gate signal, as the first node is charged to a high level. The discharging section is connected to the first node. The discharging section discharges a voltage potential of the first node to a first off-voltage in response to a gate signal of a high level applied from a next stage. The holding section is connected to an output node and the first node. The holding section holds a voltage potential of the first node to the first off-voltage. The holding control section is connected to the first node and the holding section. The holding control section receives the first clock signal and the second clock signal. The holding control section holds a voltage potential of the holding section to a second off-voltage through a second node in accordance with the second clock signal to prevent floating of the holding section.

According to the gate drive circuit and the display apparatus having the gate drive circuit, different off-voltages are provided to a transistor included in a gate drive circuit providing a display area with a gate signal to enhance off-characteristics, so that the reliability of the gate drive circuit may be improved. Moreover, the reliability of a display apparatus in which the gate drive circuit is integrated may be improved.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
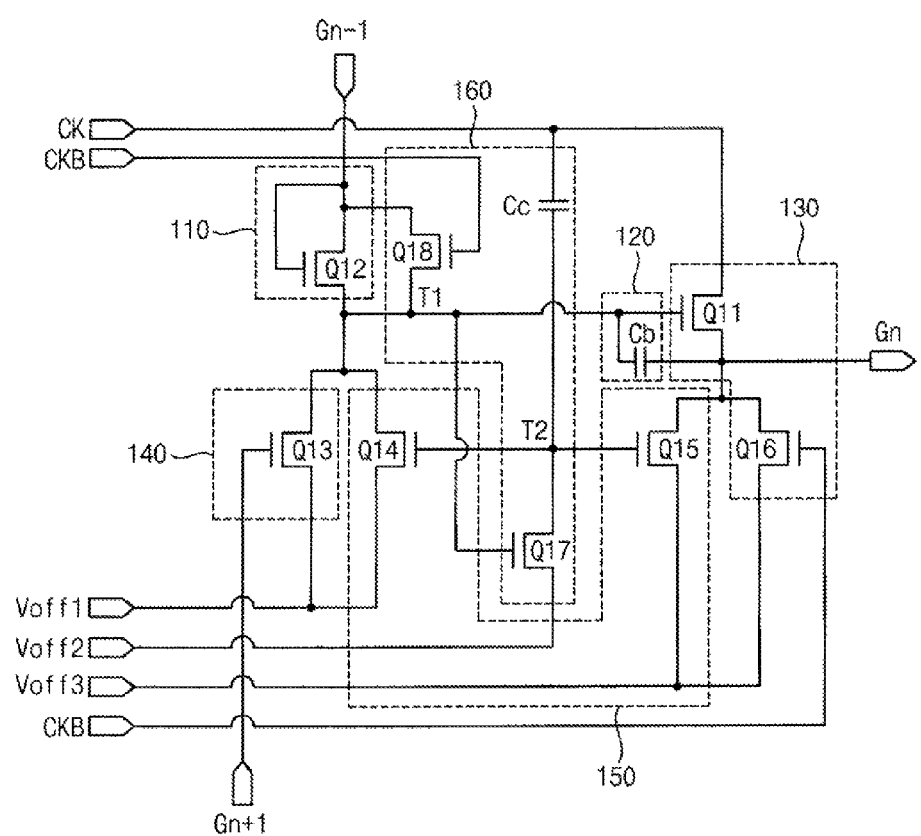
FIG. 1 is a circuit diagram illustrating a unit stage of a gate drive circuit according to an exemplary embodiment of the present invention.

Exemplary embodiments of the present invention are described more fully hereinafter with reference to the accompanying drawings. The exemplary embodiments may, however, take many different forms and should not be construed as limited to the specific exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present.

Figure 2:
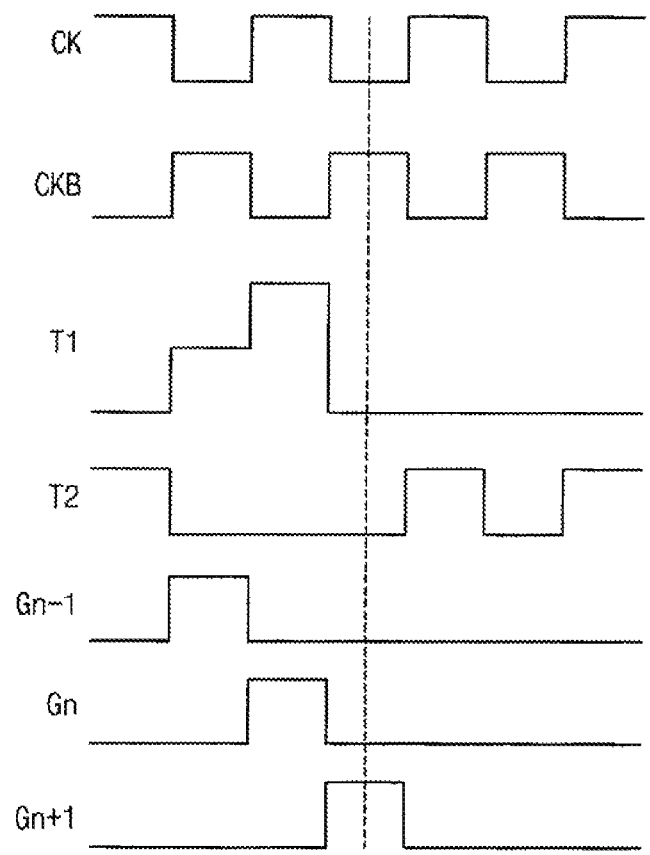
FIG. 2 is a waveform diagram illustrating the operation of the unit stage of FIG. 1.
Figure 3:
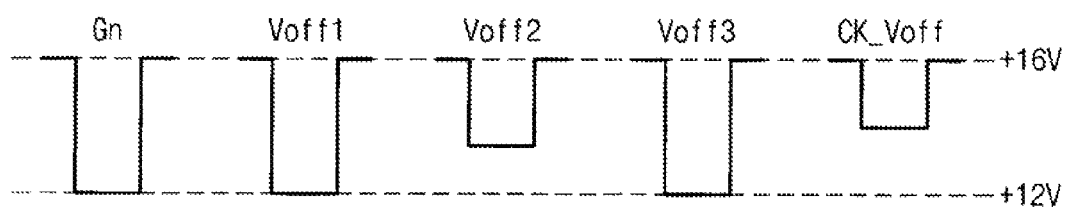
FIG. 3 is a waveform diagram illustrating relative amplitudes of off-voltages of FIG. 1.

FIG. 1 is a circuit diagram illustrating a unit stage of a gate drive circuit according to an exemplary embodiment of the present invention. FIG. 2 is a waveform diagram illustrating the operation of the unit stage of FIG. 1. FIG. 3 is a waveform diagram illustrating relative amplitudes of off-voltages of FIG. 1.

A gate drive circuit includes a shift register in which plurality of stages are connected one after another to each other. A start signal is coupled to an input terminal of a first stage. Each of the stages then sequentially outputs output signals of respective gate lines. Referring to FIGS. 1 to 3, each of the stages includes a buffer section 110, a charging section 120, a driving section 130, a discharging section 140, a holding section 150 and a holding control section 160.

The buffer section 110 receives the scan start signal STY or a carry signal provided from a previous stage. The carry signal may be a gate signal that is output from the previous stage. The buffer section 110 includes a buffer transistor Q12. The gate and drain of the buffer transistor Q12 are commonly connected to each other to receive the scan start signal STV or the carry signal, and a source of the buffer transistor Q12 is connected to the charging section 120, the driving section 130, the discharging section 140, the holding section 150 and the holding control section 160.

The charging section 120 includes a charging transistor Cb to charge the scan start signal STV or the carry signal provided through the buffer section 110.

The driving section 130 is connected to the charging section 120 through a first node T1. As the first node T1 is charged at a high level, the driving section 130 pulls up a high level of a first clock signal CK to output a gate signal of a high level through an output node. The driving section 130 may include a pull-up transistor Q11 and a pull-down transistor Q16. The pull-up transistor Q11 includes a drain that receives a first clock signal, a gate connected to a first terminal of the charging capacitor Cb, and a source connected to a second terminal of the charging capacitor Cb and the output node. The first terminal of the charging capacitor Cb is defined as the first node T1. The pull-down transistor Q16 includes a drain connected to the output node, a gate that receives a first clock signal CKB and a source that receives a third off-voltage Voff3.

The discharging section 140 is connected to the first node T1 to discharge a voltage potential of the first node T1 to a first off-voltage Voff1 in response to a gate signal of a high level that is applied from a next stage. The discharging section 140 includes a discharging transistor Q13 having a drain connected to the charging section 120, a gate that receives a gate signal of a high level that is applied to the next stage and a source that receives the first off-voltage Voff1.

The holding section 150 is connected to the output node and the first node T1 to hold a voltage potential of the first node T1 to the first off-voltage Voff1 in accordance with the first clock signal.

The holding section 150 includes a first holding transistor Q14 and a second holding transistor Q15. The first holding transistor Q14 includes a drain connected to the charging section 120, a gate that receives the first clock signal CK and a source that receives the first off-voltage Voff1. The second holding transistor Q15 includes a drain connected to the output node, a gate connected to the gate of the first holding transistor Q14 and a source that receives a third off-voltage Voff3.

The holding control section 160 is connected to the first node T1 and the holding section 150 to receive the first and second clock signals CK, CKB. The holding control section 160 prevents floating of the holding section 150 by holding a voltage potential of the holding section 150 to a second off-voltage Voff2 through a second node T1 in accordance with the second clock signal CKB.

The holding control section 160 includes a first holding control transistor Q18 and a second holding control transistor Q17. The first holding control transistor Q18 includes a drain that receives an output signal of a previous stage, a gate that receives a second clock signal CKB and a source connected to the first node T1. The second holding control transistor Q17 includes a drain that receives the first clock signal CK, a gate connected to the first node T1 and a source that receives the second off-voltage Voff2. The holding control section 160 further includes a coupling capacitor Cc disposed between a clock terminal that receives the first clock signal CK and the second node T2.

In an operation, when a second clock signal CKB and a previous gate signal Gn−1 are high level, the buffer transistor Q12 and the pull-down transistor Q16 are turned on. Thus, the buffer transistor Q12 transfers a high voltage to the first node T1 to turn-on the pull-up transistor Q11 and the second holding control transistor Q17. Therefore, the second holding control transistor Q17 transfers the second off-voltage Voff2 and the pull-down transistor Q16 transfers the first off-voltage Voff1 to an output terminal to which a gate signal is output. Moreover, the pull-up transistor Q11 is turned on to output the first clock signal CK so that the first clock signal CK is output to the output terminal. Here, the first clock signal CK is the first off-voltage Voff1, so that the gate signal Gn maintains the first off-voltage Voff1. Simultaneously, the charging capacitor Cb charges a voltage corresponding to a difference between a high voltage and the first off-voltage Voff1. Here, a following gate signal Gn+1 is a low level, so that the discharging transistor Q13 and the first and second holding transistors Q14, Q15 are in a turned-off state.

Then, when the first clock signal CK is a high level and the second clock signal CKB is a low level, the second holding transistor Q15 and the pull-down transistor Q16 are turned off. Accordingly, an output terminal from which a gate signal is output is isolated from the third off-voltage Voff3 and is connected to the first clock signal CK, so that the output terminal outputs a high voltage as a gate signal Gn. Here, the charging capacitor Cb charges a voltage corresponding to a difference between the high voltage and the third off-voltage Voff3. A voltage potential of the coupling capacitor Cc, that is, a voltage potential of the first node T1 is further increased by the high voltage.

Then, when the first clock signal is a low level, the first node T1 is in a floating state so that the pull-up transistor Q11 maintains a previous voltage to maintain a turned-on state and an output terminal outputting a gate signal outputs a first clock signal CK that is a low level. Moreover, the second holding control transistor Q17 also maintain a turned-on state, so that the second node T2 maintains a second off-voltage Voff2.

Then, when a following gate signal Gn+1 is a high, the discharging transistor Q13 is turned on to deliver the first off-voltage Voff1 to the first node T1. Accordingly, the pull-up transistor Q11 is turned off, so that a connection with an output terminal of the first clock signal CK is isolated.

Simultaneously, since the second clock signal CKB is a high level so that the pull-down transistor Q16 is turned on and an output terminal is connected to the first off-voltage Voff1, the output terminal continuously outputs the third off-voltage Voff3. Moreover, since the second holding control transistor Q17 is turned off and the second node T2 is in a floating state, the second node T2 maintains the second off-voltage Voff2 that is a previous voltage. Here, a control (gate) terminal of the second holding control transistor Q17 is connected to the first node T1, and an input (source) terminal of the second holding control transistor Q17 is connected to the first off-voltage Voff1. A voltage between the control terminal and the input terminal, that is, a gate-source voltage Vgs corresponds to a difference between the second off-voltage Voff2 and the first off-voltage Voff1, so that the gate-source voltage Vgs is a negative value.

According to an exemplary embodiment of the present invention, the different off-voltages, that is, the first off-voltage Voff1, the second off-voltage Voff2 and the third off-voltage Voff3 are applied to a unit stage of a gate drive circuit, so that off-characteristics of transistors are improved.

According to an exemplary embodiment, the different off-voltages are shown in FIG. 3. That is, levels of the first and third off-voltages Voff1, Voff3 are substantially equal to an off-level of the gate signal Gn. A level of the second off-voltage Voff2 is greater than a level of the first off-voltage Voff1, and a level of the second off-voltage Voff2 is substantially smaller than an off-level of the first clock signal CK. In an exemplary embodiment, levels of the first and third off-voltages Voff1, Voff3 and an off-level of the gate signal Gn are about −12 V.

A gate-source voltage Vgs of the pull-up transistor Q11 that is turned off is a value of which the third off-voltage Voff3 is subtracted from the first off-voltage Voff1. When the gate-source voltage Vgs of the pull-up transistor Q11 is positioned at a voltage potential that is less than or equal to 0V, leakage current through the pull-up transistor Q11 may be decreased. Moreover, a gate-source voltage Vgs of the buffer transistor Q12 that is turned off is a value of which the first off-voltage Voff1 is subtracted from the third off-voltage Voff3. When the gate-source voltage Vgs of the buffer transistor Q12 is positioned at a voltage potential that is less than or equal to 0V, leakage current through the buffer transistor Q12 is decreased. Moreover, a gate-source voltage Vgs of the discharging transistor Q13 that is turned off is a value of which the first off-voltage Voff1 is subtracted from the third off-voltage Voff3. When the gate-source voltage Vgs of the discharging transistor Q13 is positioned at a voltage potential that is less than or equal to 0V, leakage current through the discharging transistor Q13 is decreased.

Thus, regarding gate-source voltages Vgs of the pull-down, buffer and discharging transistors Q11, Q12, Q13, when the first off-voltage Voff1 is substantially equal to the third off-voltage Voff3, off-characteristics of the pull-down, buffer and discharging transistors Q11, Q12, Q13 are optimized.

A gate-source voltage Vgs of the first holding transistor Q14 that is turned off is a value of which the first off-voltage Voff1 is subtracted from the second off-voltage Voff2 or the third off-voltage Voff3 is subtracted from the clock off-voltage CLK_Voff. In an exemplary embodiment, the clock off-voltage CLK_Voff is a low level of the first clock CK or a low level of the second clock signal CKB. When the gate-source voltage Vgs of the first holding transistor Q14 is positioned at a voltage potential that is less than or equal to 0V, leakage current through the first holding transistor Q14 is decreased. Moreover, a gate-source voltage Vgs of the first holding transistor Q15 that is turned off is a value of which the third off-voltage Voff3 is subtracted from the second off-voltage Voff2 or the third off-voltage Voff3 is subtracted from the clock off-voltage CLK_Voff. When the gate-source voltage Vgs of the first holding transistor Q15 is positioned at a voltage potential that is less than or equal to 0V, leakage current through the first holding transistor Q15 is decreased.

Thus, regarding gate-source voltages Vgs of the first and second holding transistors Q14, Q15, during a turn-off interval of the second holding control transistor Q17, when the first off-voltage Voff1 is greater than the second off-voltage Voff2, the third off-voltage Voff3 is greater than the second off-voltage Voff2, the first off-voltage Voff1 is greater than the clock off-voltage CLK_Voff, and the third off-voltage Voff3 is greater than the clock off-voltage CLK_Voff, off-characteristics of the first and second holding transistors Q14, Q15 are improved.

A gate-source voltage Vgs of the pull-down transistor Q16 that is turned off is a value of which the third off-voltage Voff3 is subtracted from the clock off-voltage CLK_Voff. When a gate-source voltage Vgs of the pull-down transistor Q16 is positioned at a voltage potential that is less than or equal to 0V, leakage current through the pull-down transistor Q16 is decreased.

Thus, regarding a gate-source voltage Vgs of the pull-down transistor Q16, when the third off-voltage Voff3 is greater than the clock off-voltage, off-characteristics of the pull-down transistor Q16 are improved.

A gate-source voltage Vgs of the second holding control transistor Q17 that is turned off is a value of which the second off-voltage Voff2 is subtracted from the first off-voltage Voff1. When a gate-source voltage Vgs of the second holding control transistor Q17 is positioned at a voltage potential that is less than or equal to 0V, leakage current through the second holding control transistor Q17 is decreased.

Regarding a gate-source voltage Vgs of the second holding control transistor Q17, when the second off-voltage Voff2 is greater than the first off-voltage Voff1, off-characteristics of the second holding control transistor Q17 are improved.

A gate-source voltage Vgs of the first holding control transistor Q18 that is turned off is a value of which the first off-voltage Voff1 is subtracted from the clock voltage CLK_Voff. When the gate-source voltage Vgs of the first holding control transistor Q18 is positioned at a voltage potential that is less than or equal to 0V, leakage current through the first holding control transistor Q18 is decreased.

Thus, regarding a gate-source voltage Vgs of the holding control transistor Q18, when the first off-voltage Voff1 is greater than the clock off-voltage CLK_Voff, off-characteristics of the holding control transistor Q18 are improved.

Regarding the above description, when off-voltages according to the following Equation 1 below are employed in a plurality of unit stages of a gate drive circuit, off-characteristics of the remaining transistors except for the second holding control transistor Q17 are improved.

$$Voff1 = Voff3 \text{ and}$$

$$CK\_Voff < Voff2 < Voff1 \quad \text{Equation 1}$$

That is, the first off-voltage Voff1 is applied to sources of the discharging transistor Q13 and the first holding transistor Q14, the second off-voltage Voff2 is applied to a source of the second holding control transistor Q17, and the third off-voltage Voff3 is applied to a source of the second holding transistor Q15 and a source of the pull-down transistor Q16. Thus, off-characteristics of transistors included in a unit stage of the gate drive circuit are improved.

Figure 4:
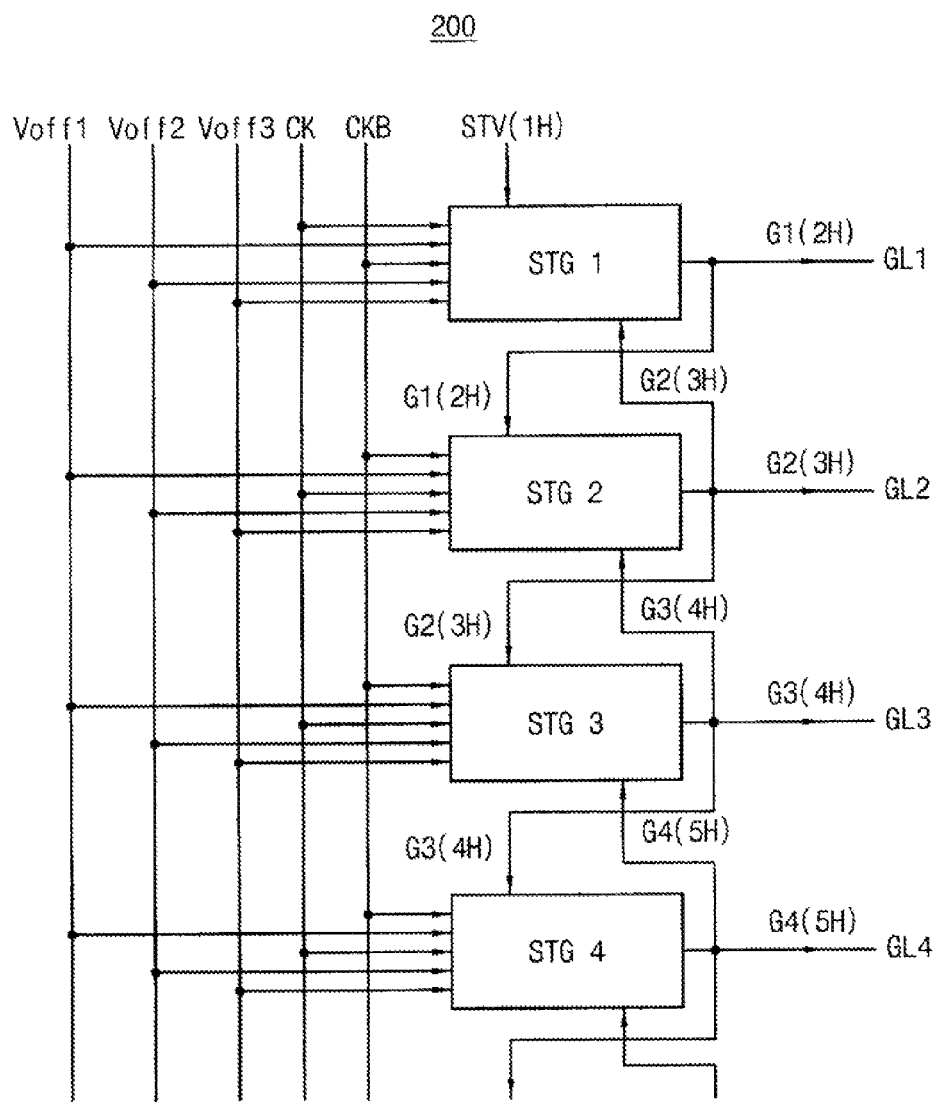
FIG. 4 is a block diagram illustrating the operation of an example of a gate drive circuit having the unit stage of FIG. 1.

FIG. 4 is a block diagram illustrating the operation of an exemplary embodiment of a gate drive circuit 200 having various stages, each of which includes the unit stage of FIG. 1.

Referring to FIGS. 1 and 4, a first clock signal CK, a second clock signal CKB, a first off-voltage Voff1, a second off-voltage Voff2 and a third off-voltage Voff3 are applied to each stage. Levels of the first and third off-voltages Voff1 and Voff3 are substantially equal to off-levels of gate signals G1, G2, G3, G4, etc., that are output from each stage. A level of the second off-voltage Voff2 is greater than that of the first off-voltage Voff1, and a level of the second off-voltage Voff2 is substantially smaller than an off-level of the first clock signal CK.

As a scan start signal STV is supplied to a first stage STG1 during a 1H time interval (or a time interval that activates the first gate line GL1), a first node T1 of the first stage STG1 is charged. The 1H time interval is defined by the following Equation is 2.

$$1H = \left(\frac{1}{f}\right) * \left(\frac{1}{\text{The number of gate lines}}\right) \quad \text{Equation 2}$$

For example, when a driving frequency 'f' and a resolution are 60 Hz and XGA (1024×768), respectively, a time of 1H is calculated by 1/60×1/768=21.7 μs.

Then, a first gate signal G1 is simultaneously output to a first gate line GL1 and a second stage STG2 in a 2H time interval, and a first node T1 of the second stage STG2 is charged.

Then, a second gate signal G2 is simultaneously output to a second gate line GL2 and a third stage STG3 in a 3H time interval, so that a first node T1 of the third stage STG3 is charged. Moreover, in order to reset the first gate line GL1, the second gate signal G2 is provided to a discharging section of the first stage STG1, so that electric charges charged in the first node T1 of the first stage STG1 are discharged.

Then, a third gate signal G3 is simultaneously output to a third gate line GL3 and a fourth stage STG4, so that a first node T1 of the fourth stage STG4 is charged. Moreover, in order to reset the second gate line GL2, the third gate signal G3 is provided to a discharging section of the second stage STG2, so that electric charges charged in the first node T1 of the second stage STG2 are discharged.

Then, a fourth gate signal G4 is simultaneously output to a fourth gate line GL4 and a fifth stage (not shown), so that a first node T1 of the fifth stage is charged. Moreover, in order to reset the third gate line GL3, the fourth gate signal G4 is provided to a discharging section of the third stage STG3, so that electric charges charged in the first node T1 of the third stage STG3 are discharged.

Figure 5:
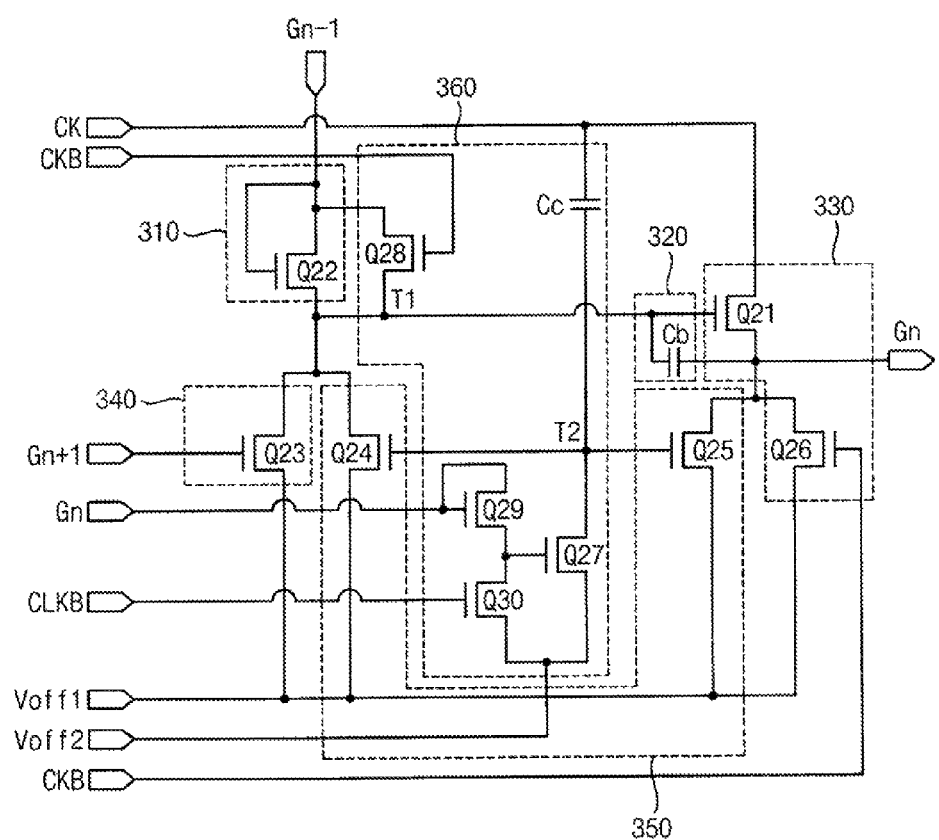
FIG. 5 is a circuit diagram illustrating a unit stage of a gate drive circuit according to an exemplary embodiment of the present invention.
Figure 6:
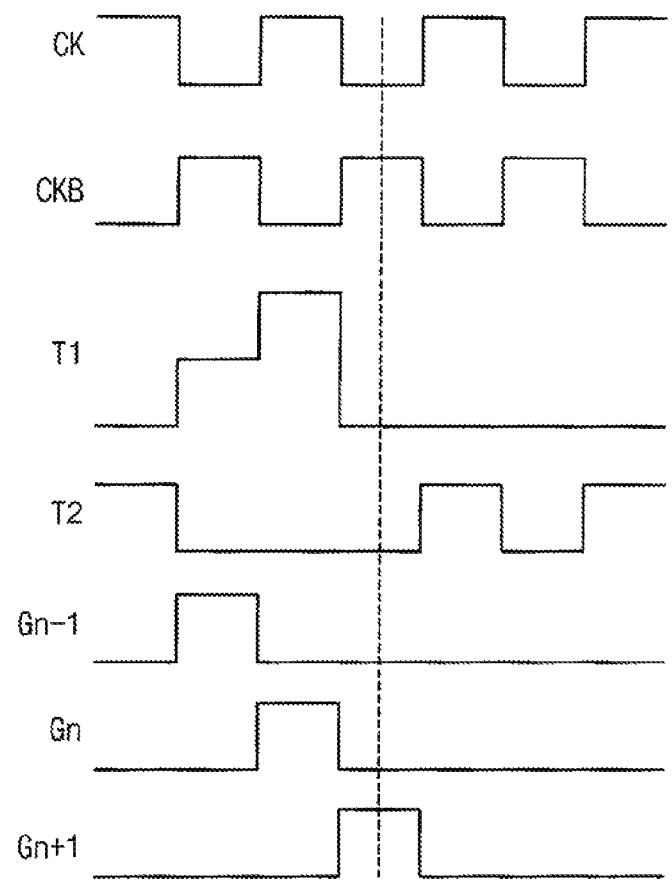
FIG. 6 is a waveform diagram illustrating the operation of the unit stage of FIG. 5.
Figure 7:
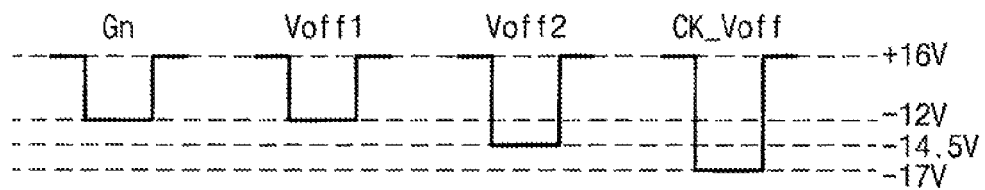
FIG. 7 is a waveform diagram illustrating relative amplitudes of off-voltages of FIG. 5.

FIG. 5 is a circuit diagram illustrating a unit stage of a gate drive circuit according to an exemplary embodiment of the present invention. FIG. 6 is a waveform diagram illustrating the operation of the unit stage of FIG. 5. FIG. 7 is a waveform diagram illustrating relative amplitudes of off-voltages of FIG. 5.

As mentioned above, a gate drive circuit according to an exemplary embodiment of the present invention includes a shift register in which a plurality of stages are connected one after another to each other. The plurality of stages have a first stage in which a start signal is coupled to an input terminal. Each of the stages sequentially outputs output signals of respective gate lines. Referring to FIGS. 5 and 6, each of the stages includes a buffer section 310, a charging section 320, a driving section 330, a discharging section 340, a holding section 350 and a holding control section 360.

The buffer section 310 receives the scan start signal STV or a carry signal provided from a previous stage. In the exemplary embodiment, a unit stage illustrated in FIG. 6 is an n-th stage ('n' being a natural number greater than 2), and the previous stage is a (n−1)-th stage.

The charging section 320 charges the scan start signal STV or the carry signal that are provided through the buffer section 310.

The driving section 330 is connected to the charging section 320 through a first node T1. As the first node T1 is charged at a high level, the driving section 330 pulls up a high level of a first clock signal CK to output a gate signal of a high level through an output node. The driving section 330 includes a pull-up transistor Q21 and a pull-down transistor Q26. The pull-up transistor Q21 includes a drain that receives a first clock signal, a gate connected to a first terminal of the charging capacitor Cb and a source connected to a second terminal of the charging capacitor Cb and the output node. The first terminal of the charging capacitor Cb is defined as the first node T1. The pull-down transistor Q26 includes a drain connected to the output node, a gate that receives a first clock signal CKB and a source that receives a third off-voltage Voff3.

The discharging section 340 is connected to the first node T1 to discharge a voltage potential of the first node T1 to a first off-voltage Voff1 in response to a gate signal of a high level that is applied from a next stage. The discharging section 340 includes a discharging transistor Q23 having a drain connected to the charging section 320, a gate that receives a gate signal Gn+1 of a high level that is applied to the next stage and a source that receives the first off-voltage Voff1.

The holding section 350 is connected to the output node and the first node T1 to hold a voltage potential of the first node T1 to the first off-voltage Voff1 in accordance with the first clock signal CK.

The holding section 350 includes a first holding transistor Q24 and a second holding transistor Q25. The first holding transistor Q24 includes a drain connected to the first node T1, a gate that receives the first clock signal CK and a source that receives the first off-voltage Voff1. The second holding transistor Q25 includes a drain connected to the output node, a gate connected to the gate of the first holding transistor Q24 and a source that receives the first off-voltage Voff1.

The holding control section 360 is connected to the first node T1 and the holding section 350 to receive the first and second clock signals CK, CKB. The holding control section 360 prevents the floating of the holding section 350 by holding a voltage potential of the holding section 350 to a second off-voltage Voff2 through a second node T2 in accordance with the second clock signal CKB.

The holding control section 360 includes a first holding control transistor Q28, a second holding control transistor Q27, a third holding control transistor Q29 and a fourth holding control transistor Q30.

The first holding control transistor Q28 includes a drain that receives an output signal of a previous stage, a gate that receives a second clock signal CKB and a source connected to the first node T1. The second holding control transistor Q27 includes a drain that receives the first clock signal CK and a source that receives the second off-voltage Voff2. The third holding control transistor Q29 includes drain and gate that are commonly connected to each other to receive the gate signal and a source connected to a gate of the second holding control transistor Q27. The fourth holding control transistor Q30 includes a drain connected to a gate of the first holding control transistor Q28, a gate that receives the second clock signal CKB, a source that receives the second off-voltage Voff2. The holding control section 360 may further include a coupling capacitor Cc disposed between a clock terminal that receives the first clock signal CK and the second node T2.

According to an exemplary embodiment of the present invention, the different off-voltages, that is, the first off-voltage Voff1, the second off-voltage Voff2 and the clock off-voltage CLK_Voff are applied to a unit stage of a gate drive circuit, so that off-characteristics of transistors are improved.

According to the exemplary embodiment, the different off-voltages are shown in FIG. 7.

That is, a level of the first off-voltage Voff1 is substantially equal to an off-level of the gate signal, a level of the second off-voltage Voff2 is substantially smaller than a level of the first off-voltage Voff1, and a low level of the first clock signal CK is substantially smaller than the second off-voltage Voff2. The level of the first off-voltage Voff1 and the off-level of the gate signal are about −12V, the level of the second off-voltage Voff2 is about −14.5V, and the low level of the first clock signal CK is about −17V.

A gate-source voltage Vgs of the pull-up transistor Q21 that is turned off is a value of which the first off-voltage Voff1 applied through the second holding transistor Q25 is subtracted from the first off-voltage Voff1 applied through the first node T1. When the gate-source voltage Vgs of the pull-up transistor Q21 is positioned at a voltage potential that is less than or equal to 0V, leakage current through the pull-up transistor Q21 is decreased. In the exemplary embodiment, the gate-source voltage Vgs of the pull-up transistor Q21 is about 0V.

A gate-source voltage Vgs of the buffer transistor Q22 that is turned off is a value of which the first off-voltage Voff1 applied through the discharging transistor Q23 is subtracted from an off-level of the gate signal Gn−1 that is output from a previous stage. When the gate-source voltage Vgs of the buffer transistor Q22 is positioned at a voltage potential that is less than or equal to 0V, leakage current through the discharging transistor Q13 is decreased. In the present embodiment, the gate-source voltage Vgs of the buffer transistor Q22 is about 0V.

The gate-source voltage Vgs of the discharging transistor Q23 that is turned off is a value of which the first off-voltage Voff1 is subtracted from an off-level of the gate signal Gn+1 that is output from a next stage. When the gate-source voltage Vgs of the discharging transistor Q23 is positioned at a voltage potential that is less than or equal to 0V, leakage current through the discharging transistor Q23 is decreased. In the present embodiment, the gate-source voltage Vgs of the discharging transistor Q23 is about 0V.

Thus, regarding gate-source voltages Vgs of the pull-up, buffer and discharging transistors Q21, Q22, Q23, when the off-level of the gate signal Gn+1 is substantially equal to the first off-voltage Voff1, off-characteristics of the pull-up, buffer and discharging transistors Q21, Q22, Q23 are optimized.

A gate-source voltage Vgs of the first holding transistor Q24 that is turned off is a value of which the first off-voltage Voff1 is subtracted from the second off-voltage Voff2 or the first off-voltage Voff1 is subtracted from the clock off-voltage CLK_Voff, during a turn-on interval. Here, the gate-source voltage Vgs of the first holding transistor Q24 is about −2.5V. Moreover, when the gate-source voltage Vgs of the first holding transistor Q24 is positioned at a voltage potential that is less than or equal to 0V, leakage current through the first holding transistor Q24 is decreased. In the present embodiment, the gate-source voltage Vgs of the first holding transistor Q24 is about −5V.

A gate-source voltage Vgs of the first holding transistor Q25 that is turned off is a value of which the third off-voltage Voff3 is subtracted from the second off-voltage Voff2 or the third off-voltage Voff3 is subtracted from the clock off-voltage CLK_Voff. Here, the value of which the third off-voltage Voff3 is subtracted from the second off-voltage Voff2 is about −2.5V, and the value of which the third off-voltage Voff3 is subtracted from the clock off-voltage CLK_Voff is about −5V.

When a gate-source voltage Vgs of the first holding transistor Q25 is positioned at a voltage potential that is less than or equal to 0V, leakage current through the first holding transistor Q25 is decreased.

Thus, regarding a gate-source voltage Vgs of a pull-down transistor Q26, when the third off-voltage Voff3 is greater than a clock off-voltage, off-characteristics of the pull-down transistor Q26 are improved.

A gate-source voltage Vgs of the first holding control transistor Q28 that is turned off is a value of which the first off-voltage Voff1 is subtracted from the clock off-voltage CLK_Voff. In the present embodiment, the gate-source voltage Vgs of the first holding control transistor Q28 is about −5V.

When a gate-source voltage Vgs of the first holding control transistor Q28 is positioned at a voltage potential that is less than or equal to 0V, leakage current through the first holding control transistor Q28 is decreased.

Thus, regarding a gate-source voltage Vgs of the first holding control transistor Q28, when the first off-voltage Voff1 is greater than the clock off-voltage, off-characteristics of the first holding control transistor Q28 are improved.

A gate-source voltage Vgs of the second holding control transistor Q27 that is turned off is a value of which the second off-voltage Voff2 is subtracted from the first off-voltage Voff1. Here, the gate-source voltage Vgs of the second holding control transistor Q27 is about 0V.

When a gate-source voltage Vgs of the second holding control transistor Q27 is in a voltage potential that is less than or equal to 0V, leakage current through the second holding control transistor Q27 is decreased.

Regarding a gate-source voltage Vgs of the second holding control transistor Q27, when the second off-voltage Voff2 is greater than the first off-voltage Voff1, off-characteristics of the second holding control transistor Q27 are improved.

A gate-source voltage Vgs of the fourth holding control transistor Q30 that is turned off is a value of which the second off-voltage Voff2 is subtracted from the clock off-voltage CLK_Voff. Here, the gate-source voltage Vgs of the fourth holding control transistor Q30 is about −2.5V.

A gate-source voltage Vgs of the third holding control transistor Q29 that is turned off is a value of which the second off-voltage Voff2 is subtracted from the first off-voltage Voff1. Here, the gate-source voltage Vgs of the third holding control transistor Q29 is about +2.5V.

In the operation of the third holding control transistor Q29, the clock off-level is maintained by the second clock signal CKB during a turn-off interval after a turn-on interval. Thus, off-characteristics of the third holding control transistor Q29 can be ignored.

Therefore, in a gate drive circuit in which ten transistors form a unit stage, three-level off-voltages are employed in the unit stage, so that off-characteristics of the gate drive circuit are improved.

Figure 8:
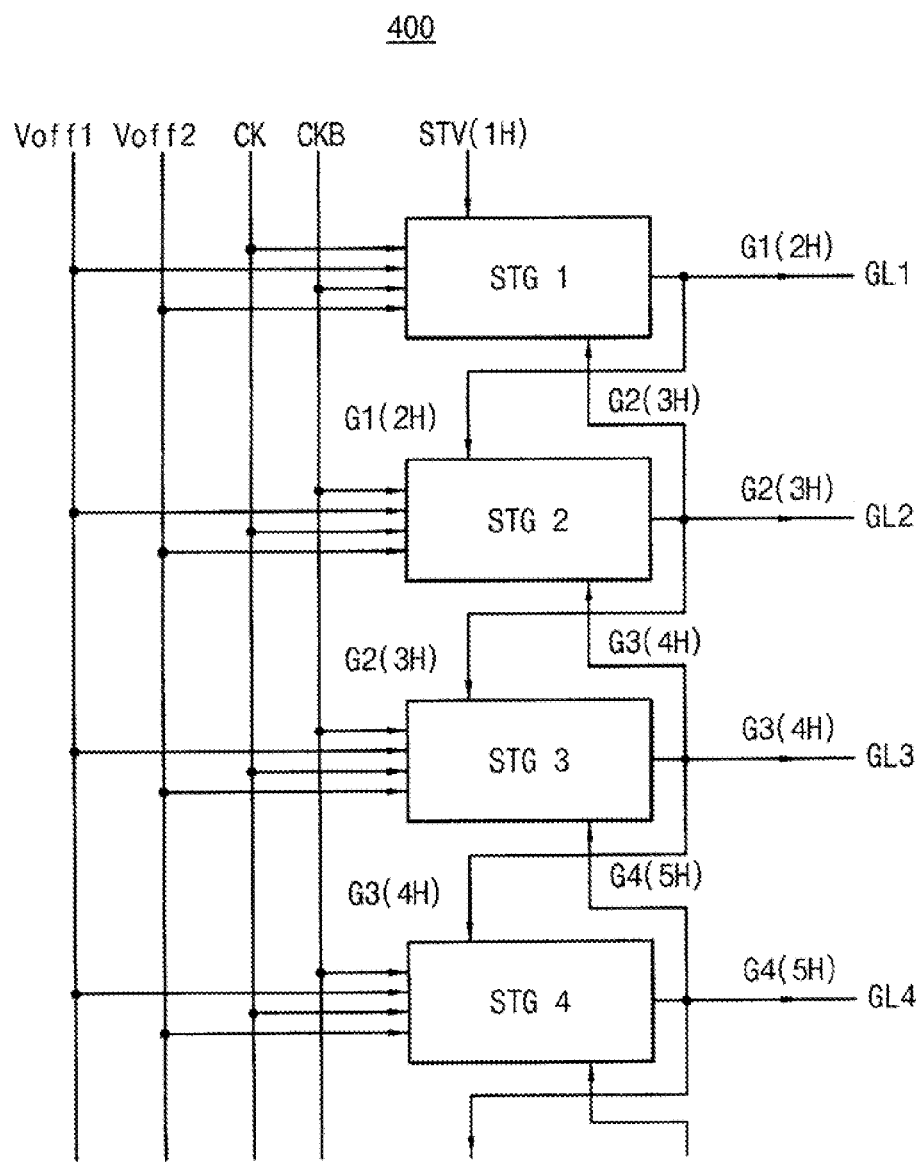
FIG. 8 is a block diagram illustrating the operation of an exemplary embodiment of the gate drive circuit having the unit stage of FIG. 5.

FIG. 8 is a block diagram illustrating the operation of an exemplary embodiment of the gate drive circuit 400 having the unit stage of FIG. 5.

Referring to FIGS. 5 to 8, a first clock signal CK, a second clock signal CKB, a first off-voltage Voff1 and a second off-voltage Voff2 are applied to each stage. A level of the first off-voltages Voff1 is substantially equal to an off-level of the gate signal. A level of the second off-voltage Voff2 is substantially smaller than that of the first off-voltage Voff1, and a low level of the first clock signal CK is substantially smaller than the second off-voltage Voff2.

As a scan start signal STV is supplied to a first stage STG1 during a 1H time interval (or a time interval that activates the first gate line GL1), a first node T1 of the first stage STG1 is charged.

Then, a first gate signal G1 is simultaneously output to a first gate line GL1 and a second stage STG2 in a 2H time interval, and a first node T1 of the second stage STG2 is charged.

Then, a second gate signal G2 is simultaneously output to a second gate line GL2 and a third stage STG3 in a 3H time interval, so that a first node T1 of the third stage STG3 is charged. Moreover, in order to reset the first gate line GL1, the second gate signal G2 is provided to a discharging section of the first stage STG1, so that electric charges charged in the first node T1 of the first stage STG1 are discharged.

Then, a third gate signal G3 is simultaneously output to a third gate line GL3 and a fourth stage STG4, so that a first node T1 of the fourth stage STG4 is charged. Moreover, in order to reset the second gate line GL2, the third gate signal G3 is provided to a discharging section of the second stage STG2, so that electric charges charged in the first node T1 of the second stage STG2 are discharged.

Then, a fourth gate signal G4 is simultaneously output to a fourth gate line GL4 and a fifth stage (not shown), so that a first node T1 of the fifth stage is charged. Moreover, in order to reset the third gate line GL3, the fourth gate signal G4 is provided to a discharging section of the third stage STG3, so that electric charges charged in the first node T1 of the third stage STG3 are discharged.

Figure 9:
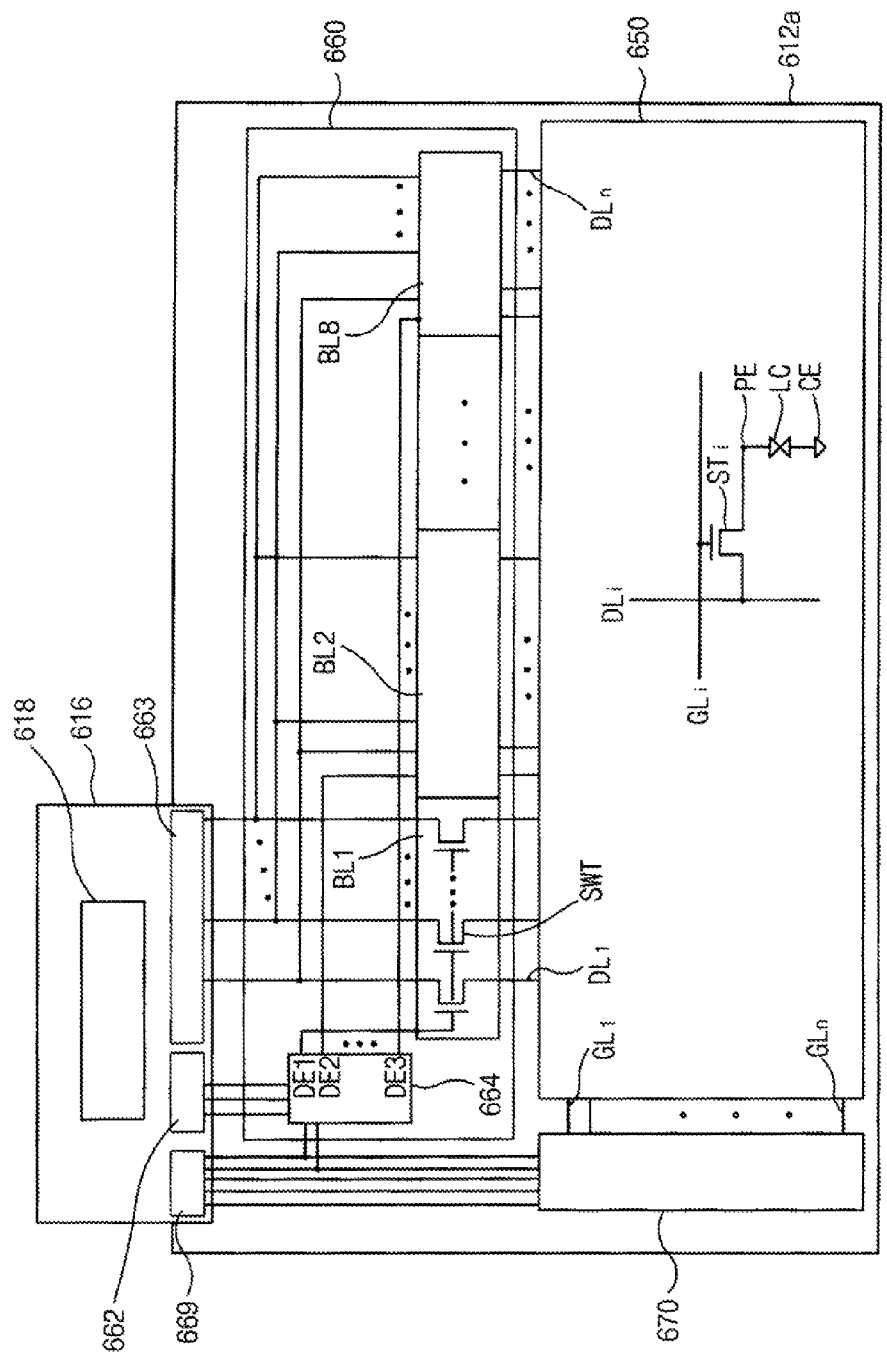
FIG. 9 is a plan view illustrating a display panel having a gate drive circuit according to an exemplary embodiment of the present invention.

FIG. 9 is a plan view illustrating a display panel having a gate drive circuit according to an exemplary embodiment of the present invention. A display cell array 650, a data driver circuit 660, a gate driver circuit 670, external connection terminals 662, 663 for connecting the data driver circuit 660 to the integrated control chip (not shown) and another external connection terminal 669 for connecting the gate driver circuit 670 to the integrated control chip are formed on a thin-film transistor (TFT) substrate 612a in the same process in which the TFTs are formed on the TFT substrate 612a.

The display cell array 650 includes m data lines DL1, DL2, ..., and DLm ('m' being a natural number) and n gate lines GL1, GL2, ..., and GLn ('n' being a natural number). The data lines DL1, DL2, ..., and DLm extend in a column direction, and the gate lines GL1, GL2, ..., and GLn extend in a row direction.

A plurality of switching transistors (switching elements) ST is formed on an intersection between the data lines DL1, DL2, ..., and DLm and the gate lines GL1, GL2, ..., and GLn. A drain of the switching transistor STi is connected to a data line DLi, a gate of the switching transistor STi is connected to a gate line GLi ('i' being a natural number), and a source of the switching transistor STi is connected to a pixel electrode PE. Liquid crystal LC is disposed between the pixel electrode PE and the common electrode CE. The switching transistor ST and the pixel electrode PE may define a pixel part.

Therefore, the voltage applied to the pixel electrode PE and the common electrode CE changes the alignment angle of the liquid crystal molecules, the amount of the light that passing through the liquid crystal molecules are regulated, and an image is displayed.

The data driver circuit 660 includes a shift register 664 and 1,600 switching transistors SWT. Each of 8 data line blocks BL1, BL2, ..., and BL8 includes 200 switching transistors SWT.

200 input terminals of each of the data line blocks are commonly connected to the external connection terminal 163, and 200 output terminals are connected to the 200 corresponding data lines, respectively. The external connection terminal 163 has 200 data input terminals. A block selection terminal is connected to an output terminal of the shift register 164.

Sources of the 1,600 switching transistors SWT are connected to the corresponding data lines, drains of the 1,600 switching transistors SWT are connected to the corresponding data input terminals, respectively, and the gates of the 1,600 switching transistors SWT are connected to the block selection terminal. Each of the 1,600 switching transistors SWT is an amorphous silicon (a-Si) TFT metal-oxide semiconductor (MOS) transistor.

Accordingly, 200 data lines of the 1,600 data lines are divided into 8 blocks, and 8 block selection signals may sequentially select each of the blocks.

The shift register 664 receives a first clock signal CKH, a second clock signal CKHB and a block selection start signal STH through the external connection terminal 662 having three terminals. Each of the output terminals of the shift register 664 is connected to the block selection terminal of the corresponding data line block.

The gate drive circuit 670 may include the gate drive circuit 200 as described in FIG. 4 or the gate drive circuit 400 as described in FIG. 8.

In FIG. 9, the gate drive circuit 670 is formed in correspondence with a short side of the TFT substrate 612a, and the data drive circuit 600 is formed in correspondence with a long side of the TFT substrate 612a. Alternatively, the gate drive circuit 670 may be formed in a long side of the TFT substrate 612a, and the data drive circuit 660 may be formed in correspondence with a short side of the TFT substrate 612a. Here, m data lines DL1-DLm extending in a row direction and n gate lines GL1-GLn extending in a column direction are formed in the display cell array circuit 650.

As described above, different off-voltages are provided to a transistor included in a gate drive circuit providing a display area with a gate signal to enhance off-characteristics, so that the reliability of the gate drive circuit is improved. Moreover, the reliability of a display apparatus in which the gate drive circuit is integrated is improved.

The foregoing exemplary embodiments are illustrative of the present invention and are not to be construed as limiting thereof. Those skilled in the art will readily appreciate that many modifications of the exemplary embodiments are possible. Accordingly, all such modifications the disclosed exemplary embodiments, as well as other exemplary embodiments, are intended to be included within the scope of the appended claims.

What is claimed is:

1. A gate drive circuit having a plurality of stages, each stage connected one after another to each other and including a first stage in which a scan start signal is provided to an input terminal, the gate drive circuit configured to sequentially output output signals of respective stages, each of the stages comprising:
    a charging section that charges the scan start signal or an output signal provided from a previous stage;
    a driving section coupled to the charging section through a first node, and configured to pull-up a high level of a first clock signal to output a gate signal as the first node is charged to a high level;
    a discharging section connected to the first node, and configured to discharge a signal of the first node to a first off-voltage in response to an output signal provided from a next stage;
    a holding section connected to an output node and the first node, and configured to hold the signal of the first node to the first off-voltage; and
    a holding control section connected to the first node and the holding section, and configured to receive the first clock signal and a second clock signal, and to hold a signal of the holding section to a second off-voltage through a second node in accordance with the second clock signal to prevent floating of the holding section, the second off-voltage being only applied to the holding control section,
    wherein the holding section comprises:
        a first holding transistor having a drain connected to the first node, a gate that receives the first clock signal, and a source that receives the first off-voltage; and
        a second holding transistor having a drain connected to the output node, a gate connected to the gate of the first holding transistor, and a source that receives the first off-voltage, and
    wherein the first off-voltage and the second off-voltage have different voltage sources.

2. The gate drive circuit of claim 1, wherein the discharging section comprises a discharging transistor having a drain connected to the charging section, a gate that receives a gate signal of a high level applied from a next stage, and a source that receives the first off-voltage.

3. A gate drive circuit having a plurality of stages, each stage connected one after another to each other and including a first stage in which a scan start signal is provided to an input terminal, the gate drive circuit configured to sequentially output output signals of respective stages, each of the stages comprising:
    a charging section that charges the scan start signal or an output signal provided from a previous stage;
    a driving section coupled to the charging section through a first node, and configured to pull-up a high level of a first clock signal to output a gate signal as the first node is charged to a high level;
    a discharging section connected to the first node, and configured to discharge a signal of the first node to a first off-voltage in response to an output signal provided from a next stage;
    a holding section connected to an output node and the first node, and configured to hold the signal of the first node to the first off-voltage; and
    a holding control section connected to the first node and the holding section, and configured to receive the first clock signal and a second clock signal, and to hold a signal of the holding section to a second off-voltage through a second node in accordance with the second clock signal to prevent floating of the holding section,
    wherein the holding section comprises:
        a first holding transistor having a drain connected to the first node, a gate that receives the first clock signal, and a source that receives the first off-voltage; and
        a second holding transistor having a drain connected to the output node, a gate connected to the gate of the first holding transistor, and a source that receives the first off-voltage,
    wherein the holding control section comprises:
        a first holding control transistor having a drain that receives an output signal of a previous stage, a gate that receives a second clock signal, and a source connected to the first node;
        a second holding control transistor having a drain that receives the first clock signal and a source that receives the second off-voltage;
        a third holding control transistor having a drain and a gate commonly connected to each other to receive the gate signal and a source connected to a gate of the second holding control transistor; and
        a fourth holding control transistor having a drain connected to a gate of the first holding control transistor, a gate that receives a second clock signal, and a source that receives the second off-voltage.

4. The gate drive circuit of claim 3, wherein:
    a level of the first off-voltage is substantially equal to an off-level of the gate signal,
    a level of the second off-voltage is substantially smaller than a level of the first off-voltage, and
    a low level of the first clock signal is substantially smaller than the second off-voltage.

5. The gate drive circuit of claim 4, wherein:
    the level of the first off-voltage and an off-level of the gate signal are about −12V,
    a level of the second off-voltage is about −14.5V, and
    a low level of the first clock signal is about −17V.

6. The gate drive circuit of claim 3, wherein the holding control section further comprises a coupling capacitor disposed between a first clock terminal that receives the first clock signal and the second node.

7. A display apparatus comprising:
    a display panel comprising a plurality of pixels, each pixel connected to a gate line and a data line that are crossed with each other;
    a data drive circuit that provides the data lines with a data voltage; and
    a gate drive circuit in which plurality of stages are connected one after another to each other, the gate drive circuit sequentially outputting output signals of respective stages, and
    each of the stages comprising:
        a charging section that charges a scan start signal or an output signal provided from a previous stage;

a driving section coupled to the charging section through a first node, and configured to pull-up a high level of a first clock signal to output a gate signal as the first node is charged to a high level;

a discharging section connected to the first node, and configured to discharge a signal of the first node to a first off-voltage in response to a gate signal of a high level applied from a next stage;

a holding section connected to an output node and the first node, and configured to hold a voltage potential of the first node to the first off-voltage; and a holding control section connected to the first node and the holding section, and configured to receive the first clock signal and a second clock signal, and configured to hold a signal of the holding section to a second off-voltage through a second node in accordance with the second clock signal to prevent floating of the holding section, the second off-voltage being only applied to the holding control section voltage, wherein the first off-voltage and the second off-voltage have different voltage sources.

8. The display apparatus of claim 7, wherein the holding section comprises:

a first holding transistor having a drain connected to the first node, a gate that receives the first clock signal, and a source that receives the first off-voltage; and a second holding transistor having a drain connected to the output node, a gate connected to the gate of the first holding transistor, and a source that receives the first off-voltage.

9. A display apparatus comprising:

a display panel comprising a plurality of pixels, each pixel connected to a gate line and a data line that are crossed with each other;

a data drive circuit that provides the data lines with a data voltage; and a gate drive circuit in which plurality of stages are connected one after another to each other, the gate drive circuit sequentially outputting output signals of respective stages, and each of the stages comprising:

a charging section that charges a scan start signal or an output signal provided from a previous stage;

a driving section coupled to the charging section through a first node, and configured to pull-up a high level of a first clock signal to output a gate signal as the first node is charged to a high level;

a discharging section connected to the first node, and configured to discharge a signal of the first node to a first off-voltage in response to a gate signal of a high level applied from a next stage;

a holding section connected to an output node and the first node, and configured to hold a voltage potential of the first node to the first off-voltage; and a holding control section connected to the first node and the holding section, and configured to receive the first clock signal and a second clock signal, and configured to hold a signal of the holding section to a second off-voltage through a second node in accordance with the second clock signal to prevent floating of the holding section, wherein the holding section comprises:

a first holding transistor having a drain connected to the first node, a gate that receives the first clock signal, and a source that receives the first off-voltage; and a second holding transistor having a drain connected to the output node, a gate connected to the gate of the first holding transistor, and a source that receives the first off-voltage, wherein the holding control section comprises:

a first holding control transistor having a drain that receives an output signal of a previous stage, a gate that receives a second clock signal, and a source connected to the first node;

a second holding control transistor having a drain that receives the first clock signal and a source that receives the second off-voltage;

a third holding control transistor having a drain and a gate commonly connected to each other that receive the gate signal, and a source connected to the gate of the second holding control transistor; and a fourth holding control transistor having a drain connected to the gate of the first holding control transistor, a gate that receives a second clock signal, a source that receives the second off-voltage.

* * * * *